United States Patent
Peng

(10) Patent No.: US 10,163,958 B2
(45) Date of Patent: Dec. 25, 2018

(54) CMOS IMAGE SENSOR

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Wenjie Peng, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/663,501

(22) Filed: Jul. 28, 2017

(65) Prior Publication Data

US 2018/0108698 A1   Apr. 19, 2018

(30) Foreign Application Priority Data

Oct. 17, 2016   (CN) .......................... 2016 1 0902296

(51) Int. Cl.
   *H01L 23/58*   (2006.01)
   *H01L 29/10*   (2006.01)
   *H01L 27/146*   (2006.01)

(52) U.S. Cl.
   CPC .... *H01L 27/14636* (2013.01); *H01L 27/1464* (2013.01); *H01L 27/14609* (2013.01);
   (Continued)

(58) Field of Classification Search
   USPC .......................... 257/13, 79–103, 191, 918, 257/E51.018–E51.022, E33.01–E33.077,
   (Continued)

(56) References Cited

U.S. PATENT DOCUMENTS 9,431,452 B1 * 8/2016 Liu .................. H01L 27/14645
2007/0001100 A1   1/2007 Hsu et al.
(Continued)

OTHER PUBLICATIONS

European Application No. 17196761.5, Extended European Search Report dated Mar. 13, 2018, 10 pages.

*Primary Examiner* — Tram H Nguyen
(74) *Attorney, Agent, or Firm* — Kilpatrick Townsend & Stockton LLP

(57) ABSTRACT

A method for manufacturing a semiconductor device includes providing a substrate structure including a substrate having a front side and a back side and a pixel region having a plurality of pixels in the front side, each pixel including a sensor element, forming a metal reflective layer in the front side of the substrate and on the pixel region, thinning the back side of the substrate, doping the thinned back side of the substrate with a dopant, and laser annealing the doped back side of the substrate. The sensor element is configured to receive incident light to the thinned back side of the semiconductor substrate. The metal reflective layer reflects heat generated in the laser annealing process to more fully activate the dopant in the back side of the substrate, thereby effectively reducing dark current and improving the device performance.

20 Claims, 13 Drawing Sheets

(52) U.S. Cl.
CPC .. *H01L 27/14623* (2013.01); *H01L 27/14629* (2013.01); *H01L 27/14643* (2013.01); *H01L 27/14689* (2013.01); *H01L 27/14692* (2013.01)

(58) Field of Classification Search
USPC .. 257/E33.054, E25.028, E25.032, E31.058, 257/E31.063, E31.115, E27.133–E27.139, 257/252–254, 257–258; 438/22–47, 69, 438/493, 503, 507, 956
See application file for complete search history.

(56) References Cited

U.S. PATENT DOCUMENTS

| | | |
|---|---|---|
| 2008/0135963 A1 | 6/2008 | Akiyama |
| 2009/0050947 A1 | 2/2009 | Dungan et al. |
| 2011/0241145 A1 | 10/2011 | Lenchenkov |
| 2011/0254115 A1 | 10/2011 | Shih et al. |
| 2013/0084660 A1* | 4/2013 | Lu ................... H01L 31/1864 438/14 |
| 2013/0133638 A1* | 5/2013 | Kulakowski ......... F24C 15/327 126/19 R |
| 2013/0134535 A1* | 5/2013 | Lenchenkov ..... H01L 27/14627 257/432 |
| 2013/0193540 A1 | 8/2013 | Liao et al. |
| 2015/0294997 A1* | 10/2015 | Kim ................... H01L 27/1463 257/432 |

\* cited by examiner

CMOS IMAGE SENSOR

CROSS-REFERENCES TO RELATED APPLICATIONS

This application claims priority to Chinese patent application No. 201610902296.5, filed on Oct. 17, 2016, the content of which is incorporated herein by reference in its entirety.

FIELD OF THE INVENTION

The present disclosure relates to the field of integrated circuits, and more particularly to a CMOS image sensor and method of fabricating the CMOS image sensor.

BACKGROUND OF THE INVENTION

A typical structure of a conventional back-illuminated CMOS image sensor is shown in FIG. 1. The conventional back-illuminated CMOS image sensor is shown to include a semiconductor substrate 100 having a front surface and a back surface. A plurality of pixel regions are formed in the front surface, and each pixel region includes a sensor element, such as a photodiode 102 and an isolation structure 106, and other devices (e.g., MOS devices) 104, adjacent to the pixel region. The back-illuminated CMOS image sensor also includes vias and contacts 1044 for connecting the active region and gates 1042 of the other devices to a multilayer interconnect structure 1046 having a plurality of metal interconnect layers that are formed after the formation of the vias (i.e., back end of line or BEOL). The back-illuminated CMOS image sensor also includes dielectric layer 112 disposed between the interconnect layers. The back-illuminated CMOS image sensor is configured to receive incident light from the back surface of substrate 100. Therefore, it is necessary to thin the back side of the substrate. However, the thinning process may cause damage and defects 108 to the back surface of the substrate. In order to isolate the defects and repair the damage, an ion implantation process is performed on the thinned back side of the substrate by forming a PN junction in the doped region 110. A laser annealing treatment may be performed after the ion implantation to melt the semiconductor substrate and activate the dopant to repair and isolate the defects.

However, these approaches have the following problems. If the laser intensity in the laser annealing process is insufficient, defects cannot be completely isolated and may enter sensor element 102, resulting in the problem of dark current. If the laser intensity in the laser annealing process is too strong, laser energy may enter multilayer interconnect structure 1046 through semiconductor substrate 100, and the thermal radiation generated by the molten semiconductor substrate may also enter multilayer interconnect structure 1046 and cause damage to the multilayer interconnect structure.

In view of the foregoing, there is a need for a novel CMOS image sensor device and method for manufacturing the same.

BRIEF SUMMARY OF THE INVENTION

The present inventor has discovered the above-described problems of the conventional approaches and provides embodiments herein to solve these problems.

Embodiments of the present disclosure overcome the aforementioned deficiencies by provide a novel CMOS image sensor and method for manufacturing the CMOS image sensor.

In accordance with the present disclosure, a method for manufacturing a semiconductor device may include providing a substrate structure including a semiconductor substrate having a front side and a back side opposite the front side and a pixel region having a plurality of pixels in the front side, each pixel including a sensor element. The method may also include forming a metal reflective layer on the pixel region in the front side of the semiconductor substrate; performing a thinning process on the semiconductor substrate from the back side to thin the semiconductor substrate; performing an ion implantation process on the thinned back side of the semiconductor substrate to form a doped back side; and performing an annealing process on the doped back side of the semiconductor substrate. The sensor element is configured to receive light incident from the thinned back side of the semiconductor substrate.

In one embodiment, the method may further include forming an insulation layer between the metal reflective layer and the pixel region.

In one embodiment, forming the metal reflective layer may include forming a first interlayer dielectric layer on the substrate structure covering the front side of the semiconductor substrate; forming a patterned mask layer on the first interlayer dielectric layer; etching the first interlayer dielectric layer using the patterned mask layer as a mask to form a recess extending from an upper surface of the first interlayer dielectric layer to a depth above the pixel region and spaced apart from the pixel region; and filling the recess with a metal material to form the metal reflective layer.

In one embodiment, the method may further include forming a multilayer interconnect structure having a plurality of metal interconnect layers disposed external to the pixel region and a plurality of interlayer dielectric layers disposed between the metal interconnect layers.

In one embodiment, performing the thinning process includes reducing a portion of the back side of the semiconductor substrate such that a distance between an upper surface of the multilayer interconnect structure and an upper surface of the thinned back side of the semiconductor substrate is less than 4 microns.

In one embodiment, the metal reflective layer is a metal floating layer that is closer to the pixel region than any other metal components adjacent to the pixel region.

In one embodiment, the sensor element is a photosensitive element.

In one embodiment, the method may further include forming a contact member in the substrate structure in contact with a surface of an active region external to the pixel region, and forming the metal reflective layer includes forming a first interlayer dielectric layer on the front side of the substrate; etching the first interlayer dielectric layer using a patterned mask layer as a mask to form a first recess extending from an upper surface of the first interlayer dielectric layer to a depth above the pixel region and spaced apart from the pixel region and a second recess in contact with the contact member; and filling the first and second recesses with a metal material to form the metal reflective layer on the pixel region and a first metal interconnect layer of a multilayer interconnect structure.

In one embodiment, the method may further include forming an interconnection layer of the multilayer interconnect structure in addition to the first metal interconnect layer in a portion of the substrate external to the pixel region;

forming an interlayer dielectric layer between the interconnection layer and the first metal interconnection layer; and forming a via extending through the interlayer dielectric layer and connecting the interconnection layer to the first metal interconnection layer.

In one embodiment, the substrate is a P-type semiconductor substrate, and performing the ion implantation process on the thinned back side of the semiconductor substrate includes a P-type dopant.

In one embodiment, the metal reflective layer includes tungsten, aluminum, or copper, and has a thickness in a range between 2000 angstroms and 5000 angstroms.

Embodiments of the present invention also provide a semiconductor device that may include a substrate structure comprising a semiconductor substrate having a front side and a back side and a pixel region in the front side, the pixel region including a plurality of pixels in the front side. Each pixel includes a sensor element. The semiconductor device may further include a metal reflective layer disposed in the front side of the semiconductor substrate and on the pixel region. The sensor element is configured to receive incident light to the back side of the semiconductor substrate.

In one embodiment, the semiconductor device may further include a multilayer interconnect structure having a plurality of metal interconnect layers disposed external to the pixel region; a plurality of interlayer dielectric layers each disposed between two adjacent metal interconnect layers; and a plurality of vias extending through the interlayer dielectric layers and configured to connect two adjacent metal interconnect layers of the a multilayer interconnect structure.

In one embodiment, a distance between an upper surface of the multilayer interconnect structure and an upper surface of the thinned back side of the semiconductor substrate is less than 4 microns.

In one embodiment, the metal reflective layer is a metal floating layer that is closer to the pixel region than any other metal components adjacent to the pixel region. In one embodiment, the sensor element is a photosensitive element.

In one embodiment, the semiconductor substrate is a P-type semiconductor substrate, and the back side of the semiconductor substrate is doped with an additional P-type dopant.

The following description, together with accompanying drawings, will provide a better understanding of the nature and advantages of the claimed disclosure.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Figure 1:
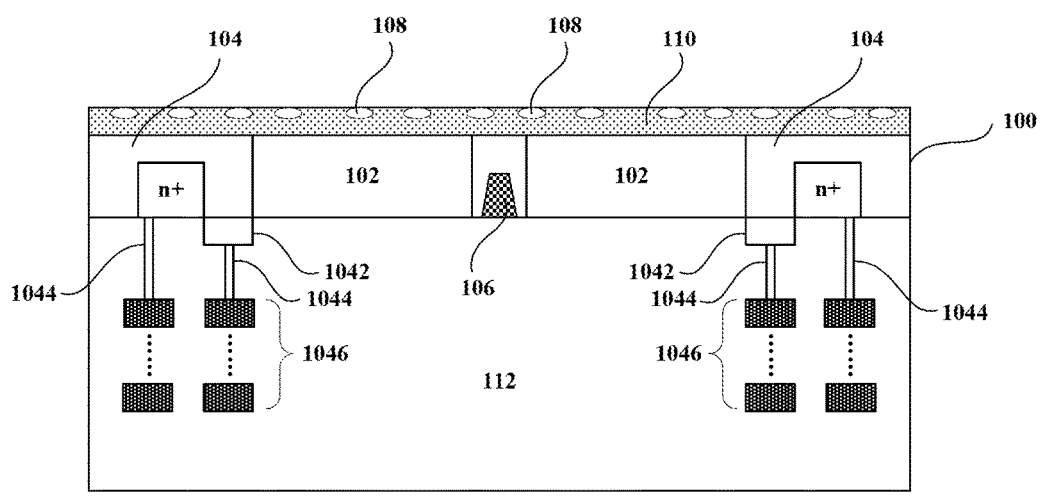
FIG. 1 is a cross-sectional view of a CMOS image sensor, as known in the prior art.

In the following description, numerous specific details are provided for a thorough understanding of the present invention. However, it should be appreciated by those of skill in the art that the present disclosure may be realized without one or more of these details. In other examples, features and techniques known in the art will not be described for purposes of brevity.

It should be understood that the drawings are not drawn to scale, and similar reference numbers are used for representing similar elements. Embodiments of the disclosure are described herein with reference to cross-section illustrations that are schematic illustrations of idealized embodiments and intermediate structures) of the disclosure. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

It will be understood that, when an element or layer is referred to as "on," "over," "overlying," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Relative terms such as "higher", "lower", "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped (turned over), the description of an element being "below" or "underneath" another element would then be oriented as "above" the other element. Therefore, the term "below," "under," or "underneath" can encompass both orientations of the device. Because devices or components of embodiments of the present disclosure can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the present disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures. The term "chip" is used to refer to an integrated circuit device including logic devices, memory devices, various types of photodiodes, and various types of transistors.

As described in the background section, a thinning process may cause damage and defects to the back surface of the substrate using conventional image sensor manufacturing processes. The present inventor has studied the above problems and proposed a novel CMOS image sensor, a semiconductor device including the CMOS sensor device and method for manufacturing the same.

Figure 2:
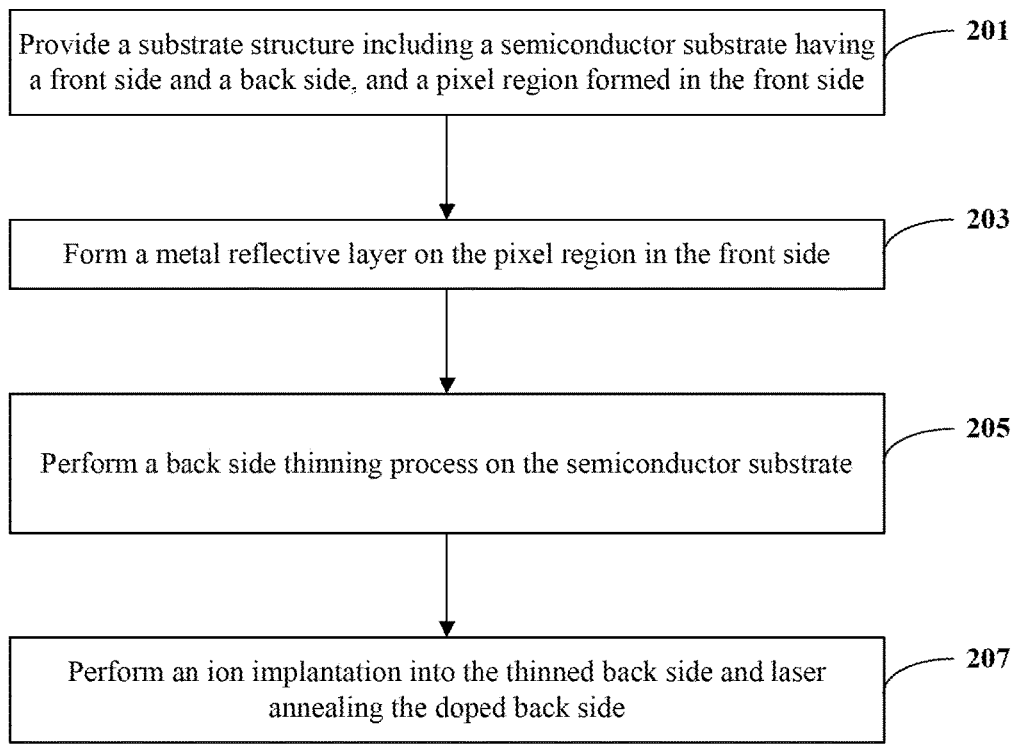
FIG. 2 is a flowchart of a method for manufacturing a semiconductor device according to one embodiment of the present invention.

FIG. 2 is a flowchart of a method for manufacturing a semiconductor device according to one embodiment of the present disclosure. FIG. 3 through FIG. 9C are cross-sectional views illustrating intermediate stages of a method for manufacturing a semiconductor device according to embodiments of the present invention. The present invention will be described in detail with reference to FIG. 2 and FIGS. 3 through 9C.

Referring to FIG. 2, the method may include providing a semiconductor substrate at step 201.

Figure 3:
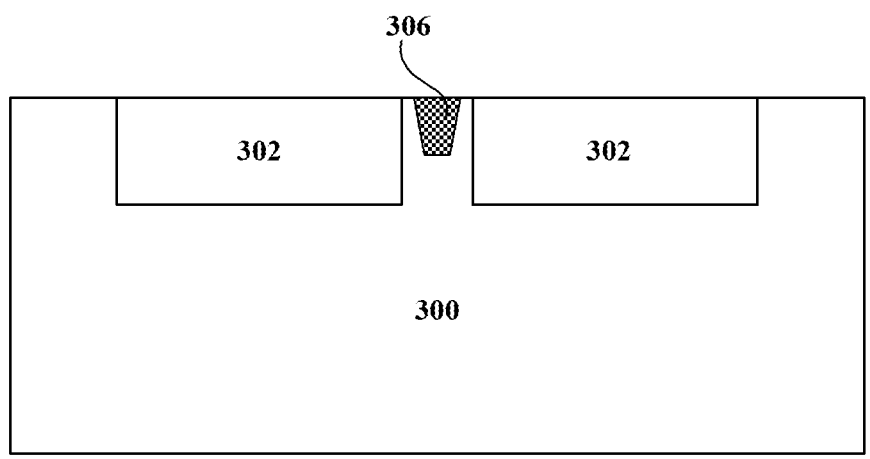
FIGS. 3 through 9C are cross-sectional views illustrating intermediate stages of a method for manufacturing a semiconductor device according to embodiments of the present invention.

Referring to FIG. 3, a semiconductor substrate 300 includes a front side and a back side. Semiconductor substrate 300 may include silicon, germanium, silicon germanium, gallium arsenide, and the like. Semiconductor substrate 300 may also include a P-type doped region or an N-type doped region. A pixel region is formed in the front side of semiconductor substrate 300 and includes a plurality of pixels. Each pixel includes a sensor element 302. Sensor element 302 may include a photosensitive member such as a photodiode.

Semiconductor substrate 300 may also include an isolation member 306 in the front side for isolation of devices (e.g., for isolation between sensor elements 302 of adjacent pixels). Isolation member 306 may include, for example, a shallow trench isolation (STI) or other isolation structure known in the art.

In one embodiment, semiconductor substrate 300 may be a P-type doped substrate. It is to be understood that the substrate structure of the present invention can be formed using techniques, process steps, and materials known in the art, therefore, the details of the substrate structure and the associated process steps are not described herein for the sake of brevity.

Referring back to FIG. 2, in step 203, the method may include forming a metal reflective layer on the pixel region in the front side of the semiconductor substrate.

Figure 4A:
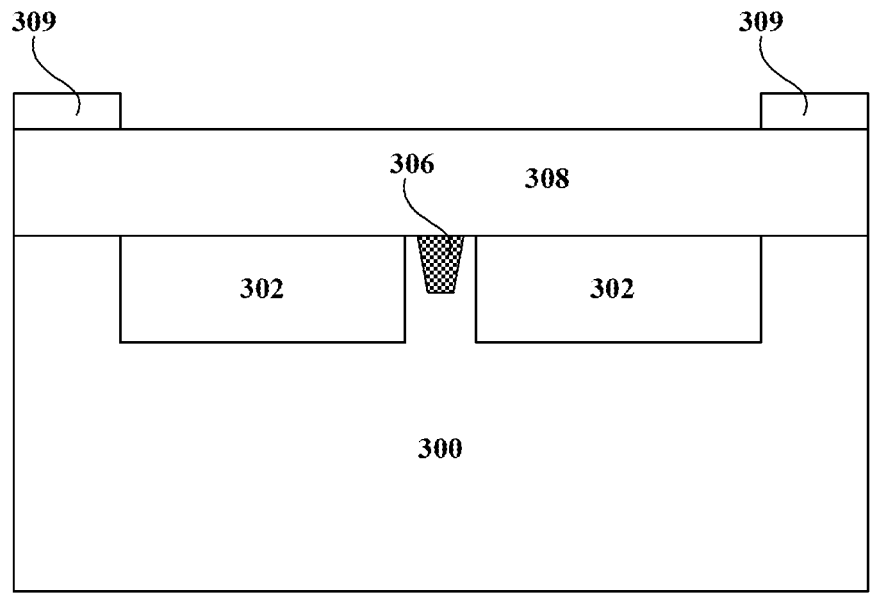
Figure 5A:
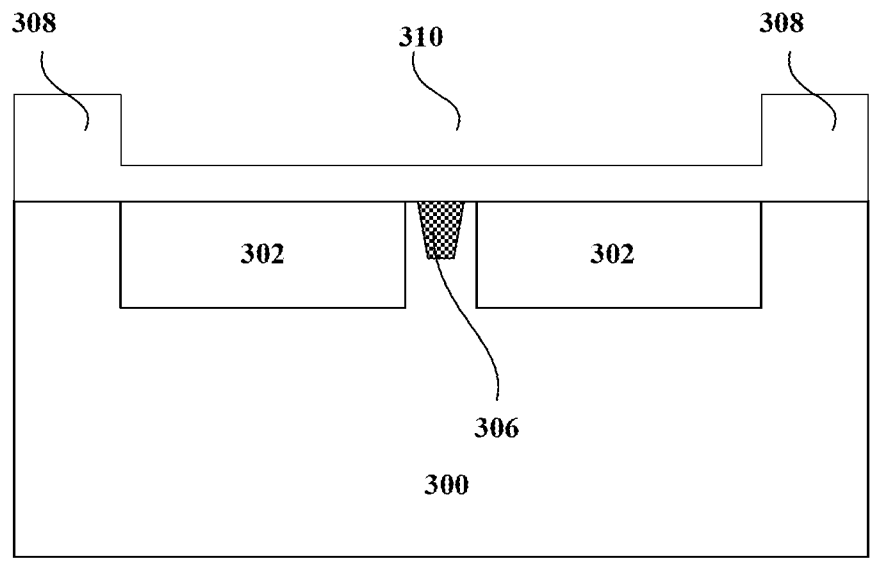
Figure 6A:
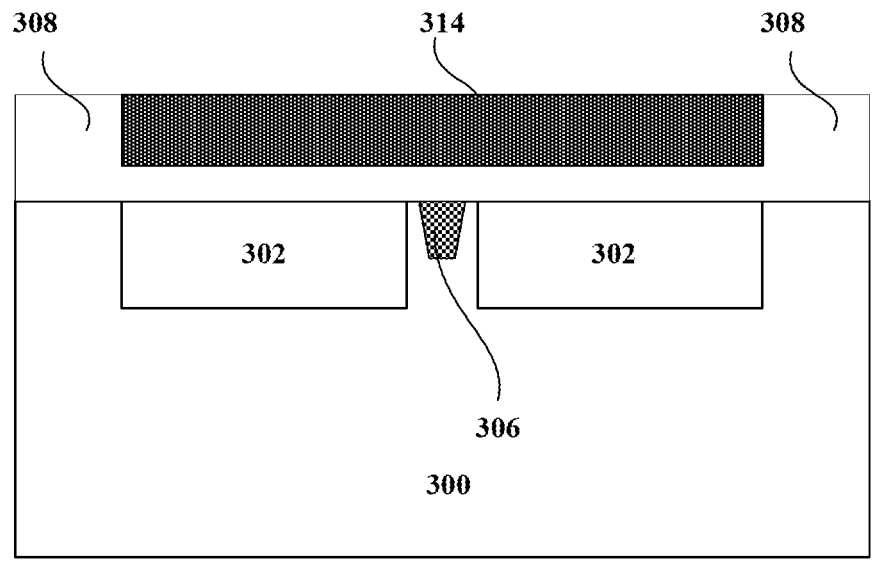

In one embodiment, a metal reflective layer is formed over the pixel region in the front side of the semiconductor substrate. In one embodiment, the metal reflective layer may be formed using the following steps. Referring to FIG. 4A, a first interlayer dielectric layer 308 is formed on the substrate structure to cover the front side of the substrate. A patterned mask layer 309 is formed on first interlayer dielectric layer 308, as shown in FIG. 4A. Thereafter, an etching process is performed on first interlayer dielectric layer 308 using patterned mask layer 309 as a mask to remove a portion of the first interlayer dielectric layer to form a recess 310 above the pixel region and isolated from the pixel region, as shown in FIG. 5A. Thereafter, recess 310 is filled with a metal material layer. In one embodiment, a chemical mechanical polishing (CMP) process is performed on the metal material layer such that the upper surface of the metal material layer is substantially flush with the upper surface of first interlayer dielectric layer 308 to form a metal reflective layer 314, as shown in FIG. 6A. The metal material layer may include tungsten, aluminum, or copper. The thus formed metal reflective layer 314 is separated from the pixel region in the first side of semiconductor substrate 300 by first interlayer dielectric layer 308, as shown in FIG. 6A.

Figure 4B:
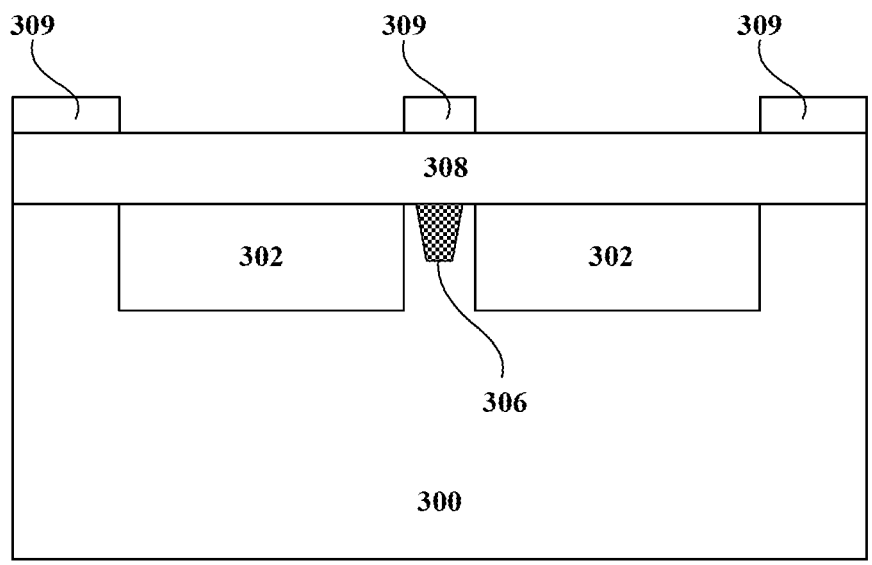
Figure 5B:
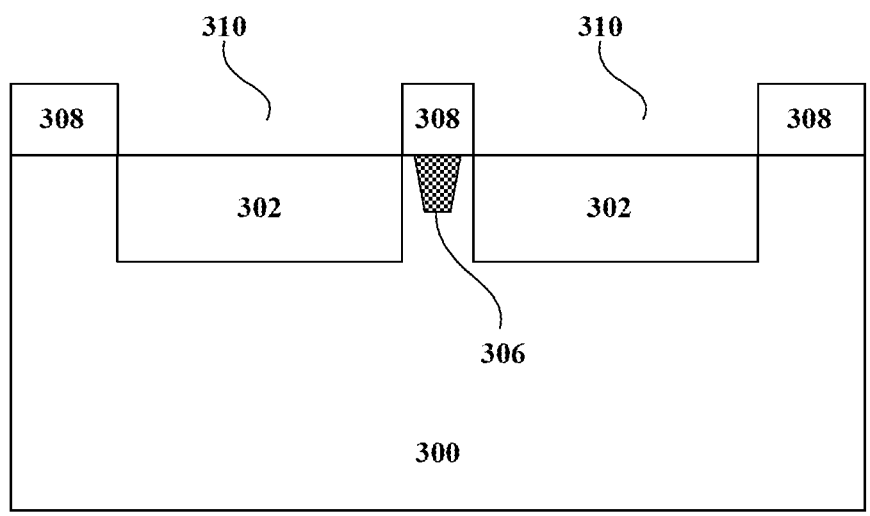
Figure 6B:
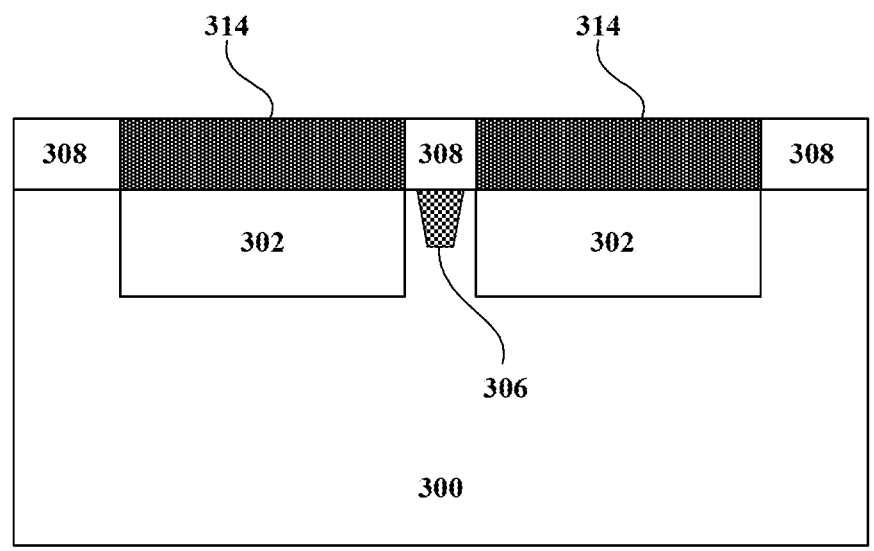

In some embodiments, a metal reflective layer may be formed as a floating metal layer on the pixel region in the front side of the semiconductor substrate. In one embodiment, a metal reflective layer 314 may be formed using the following steps. Referring to FIG. 4B, a first interlayer dielectric layer 308 is formed on the substrate structure covering the front side of the semiconductor substrate. Thereafter, a patterned mask layer 309 is formed on first interlayer dielectric layer 308. An etching process is then performed on first interlayer dielectric layer 308 using patterned mask layer 309 as a mask to form a plurality of recesses 310 that are separated from each other and expose a surface of the pixel region. That is, the exposed surface of the pixel region is the bottom of the recesses, as shown in FIG. 5B. The mutually isolated recesses 310 are then filled with a metal material layer. In one embodiment, a chemical mechanical polishing (CMP) process is performed on the metal material layer such that the upper surface of the metal material layer is substantially flush with the upper surface of first interlayer dielectric layer 308 to form a metal reflective layer 314, as shown in FIG. 6B. The metal material layer may include tungsten, aluminum, or copper. The thus formed metal reflective layer 314 is electrically floating, as shown in FIG. 6B.

Figure 6C:
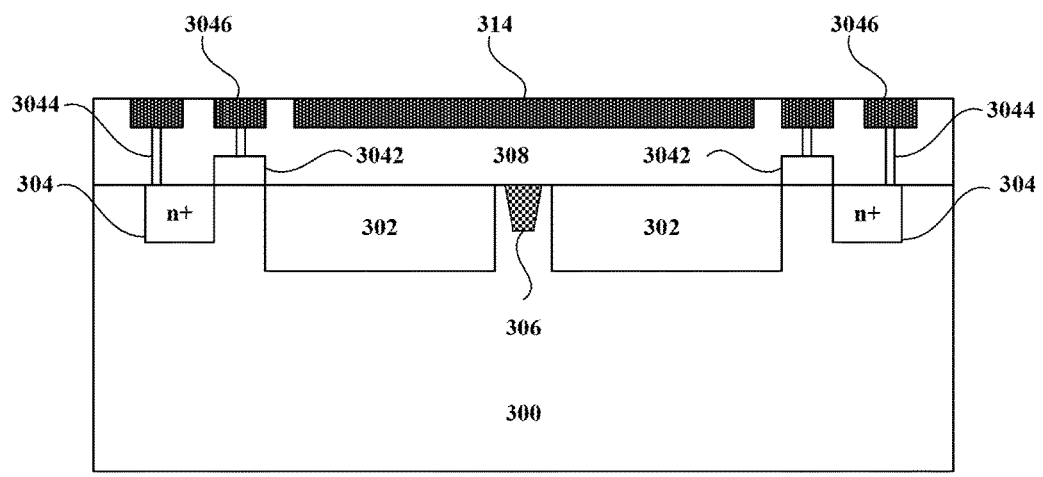

In some other embodiments, a region for other devices adjacent to the pixel region (or sensor element) is also formed in the front side of semiconductor substrate 300. The region for other devices may include various passive and active microelectronic devices, e.g., MOS/CMOS devices, disposed outside the pixel region. FIG. 6C shows an exemplary embodiment including a MOS device. The MOS device is shown to include a gate structure 3042, a first doped region 304 as one of a source and drain region, and a second doped region 304 as another one of the source and drain region. It is to be understood that, for the sake of clarity and conciseness of the illustration, only the gate structure is shown and detail of the gate structure is omitted. It will be readily appreciated by those of skill in the art that the gate structure may include a gate dielectric layer on the active region, a gate on the gate dielectric layer, and spacers on opposite sides of the gate.

In some embodiments, multiple recesses for through holes 3044 and contacts 3046 may also be formed concurrently (at the same time) when performing the etching process on first interlayer dielectric layer 308 using a patterned mask layer 309 as a mask to form recesses 310. Through holes 3044 and contacts 3046 will be used for forming a first interconnect layer in a multilayer interconnect structure in a subsequent BEOL process. Thereafter, through holes 3044 and contacts 3046 are filled with a metal material to form vias and a first metal interconnect layer of multilayer interconnect structure 3046, as shown in FIG. 6C. Next, the other metal interconnect layers of multilayer interconnect structure 3046 are formed, and interlayer dielectric layers are disposed between the metal interconnect layers. The resulting metal reflective layer 314 is a metal floating layer and is closer to the pixel region than any other metal components, e.g., multilayer interconnect structure 3046. In one embodiment, metal reflective layer 314 has a thickness in the range between 2000 angstroms and 5000 angstroms.

Alternatively, in some other embodiments, metal reflective layer 314 is first formed, followed by the metal interconnect layers of multilayer interconnect structure 3046. Interlayer dielectric layers are disposed between the metal interconnect layers of multilayer interconnect structure 3046. In the embodiments, metal reflective layer 314 may have a different material that the material of multilayer interconnect structure 3046, so that metal reflective layer 314 can better reflect heat radiation in a subsequent laser annealing process to prevent multilayer interconnect structure 3046 from being damaged by the heat radiation, thereby adversely affecting the device performance. In one embodiment, the formed metal reflective layer 314 may be a metal floating layer having a plurality of mutually isolated portions that are in contact with the upper surface of the pixel region, as shown in FIG. 6B. In another embodiment, the formed metal reflective layer 314 is disposed on the pixel region having an insulation layer (e.g., first dielectric layer 308) interposed between the pixel region and metal reflective layer 314.

Next, referring back to FIG. 2, a thinning process is performed on the back side of the semiconductor substrate in step 205.

Figure 7A:
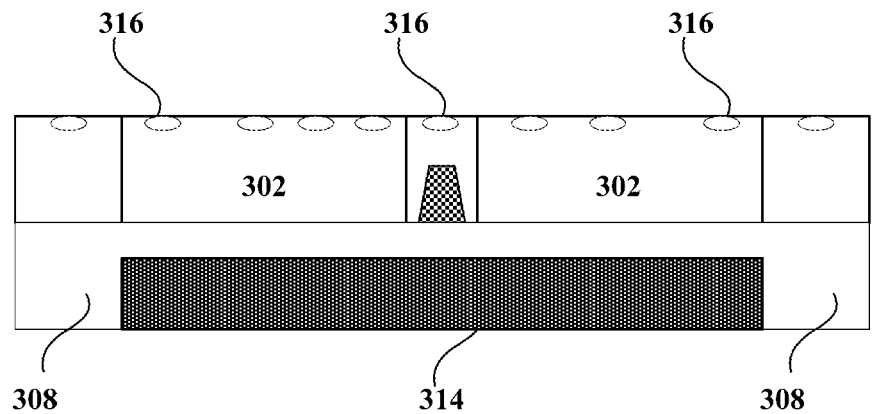
Figure 7B:
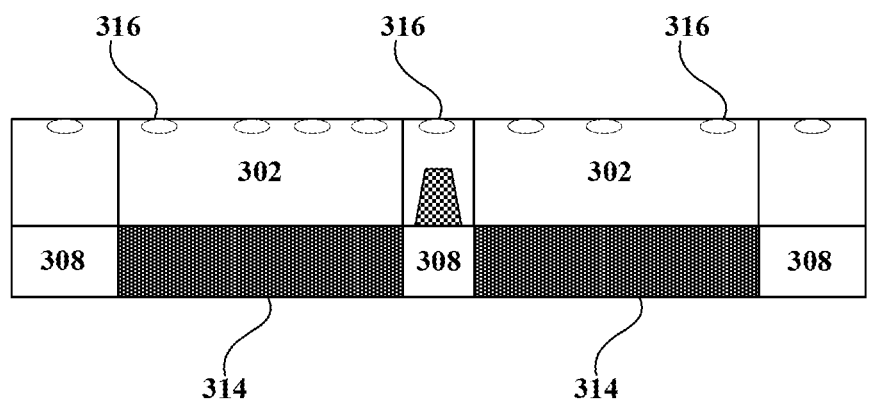

In one embodiment, a thinning process performed on the back side of the semiconductor substrate shown in FIGS. 6A and 6B may cause defects 316 to the back side and damage the semiconductor substrate, as shown in FIGS. 7A and 7B. That is, sensor element 302 is configured to receive light incident from the back side of the semiconductor substrate. It will be appreciated that the semiconductor substrate may be thinned from the back side using any thinning methods known in the art (e.g., etching or CMP process).

Figure 7C:
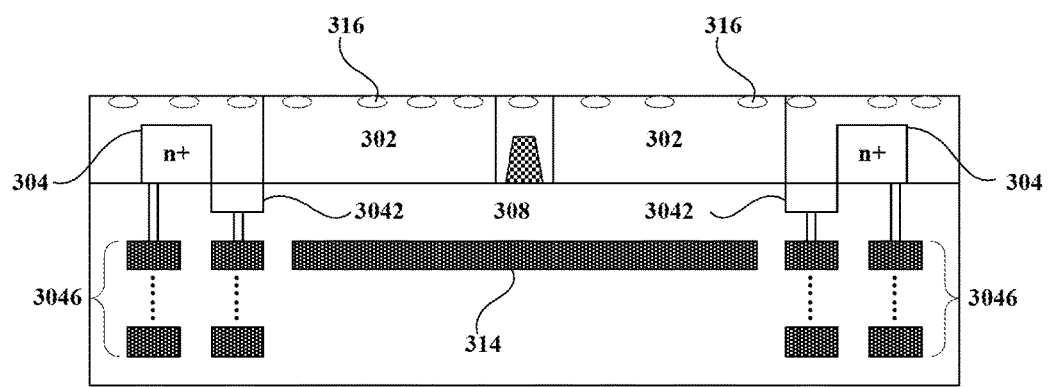

In another embodiment, the semiconductor substrate may be thinned to a distance between the upper surface of multilayer interconnect structure 3046 to the back side of the semiconductor substrate of less than 4 microns, as shown in FIG. 7C.

Next, referring back to FIG. 2, an ion implantation is performed on the thinned back side of the semiconductor substrate to introduce a dopant to the semiconductor substrate, and performing an annealing process on the doped region to activate the dopant.

Figure 8A:
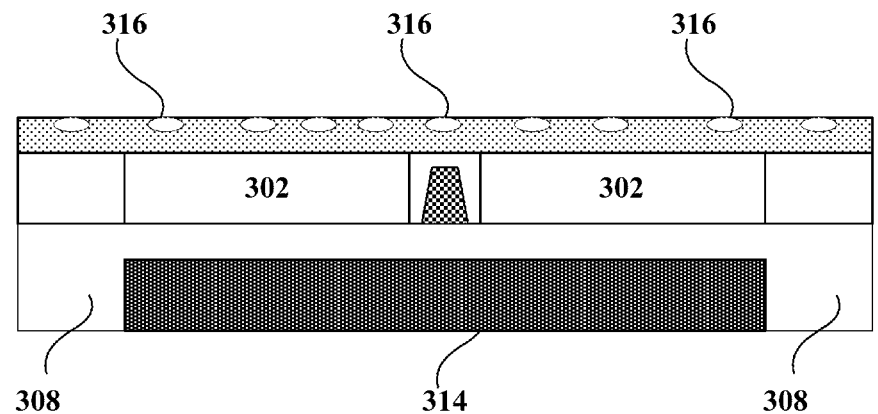
Figure 8B:
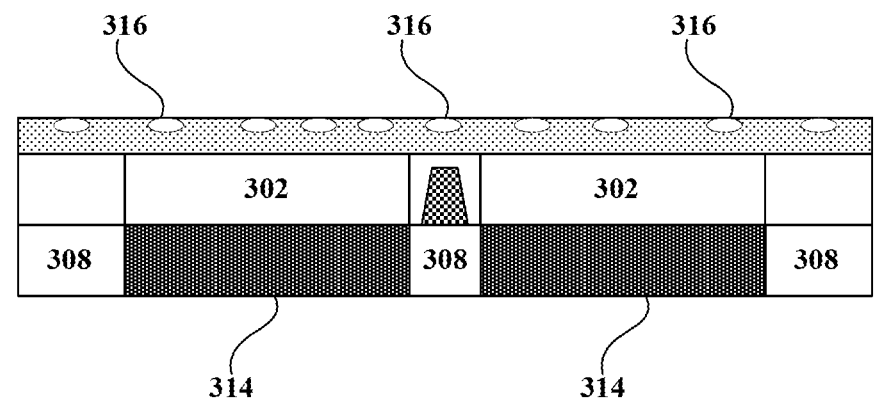
Figure 8C:
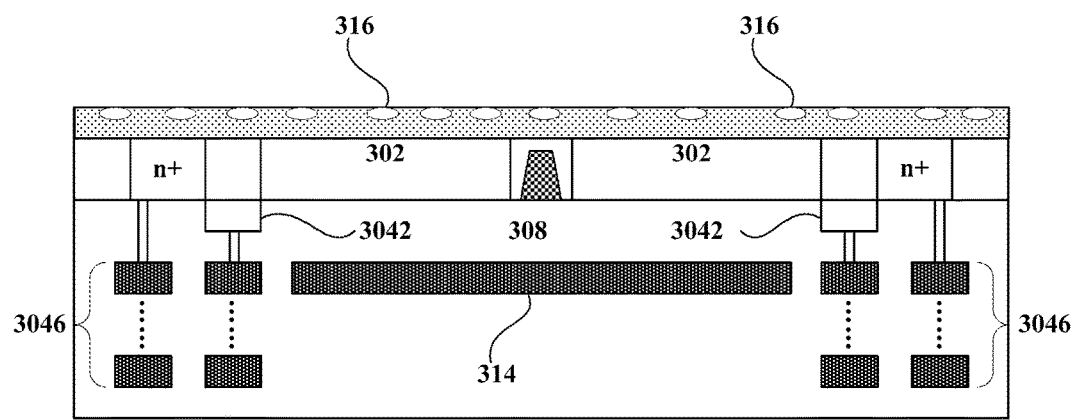
Figure 9A:
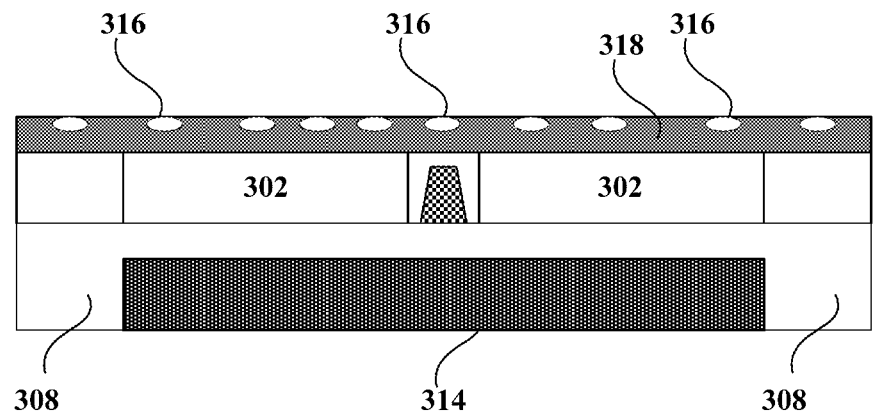
Figure 9B:
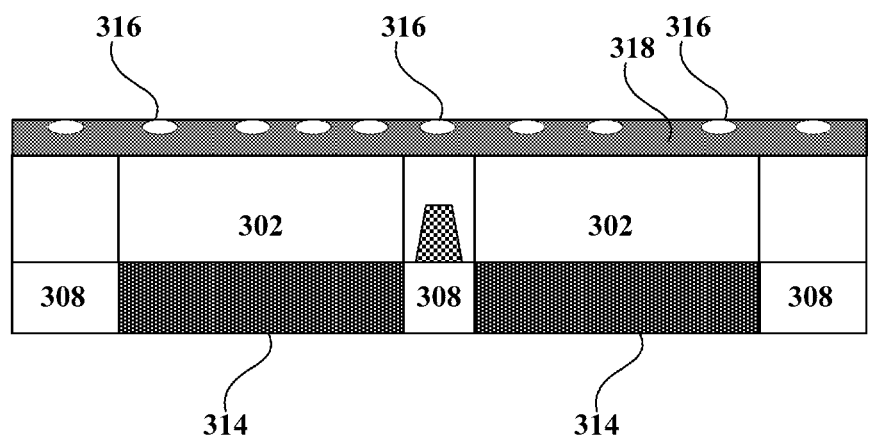
Figure 9C:
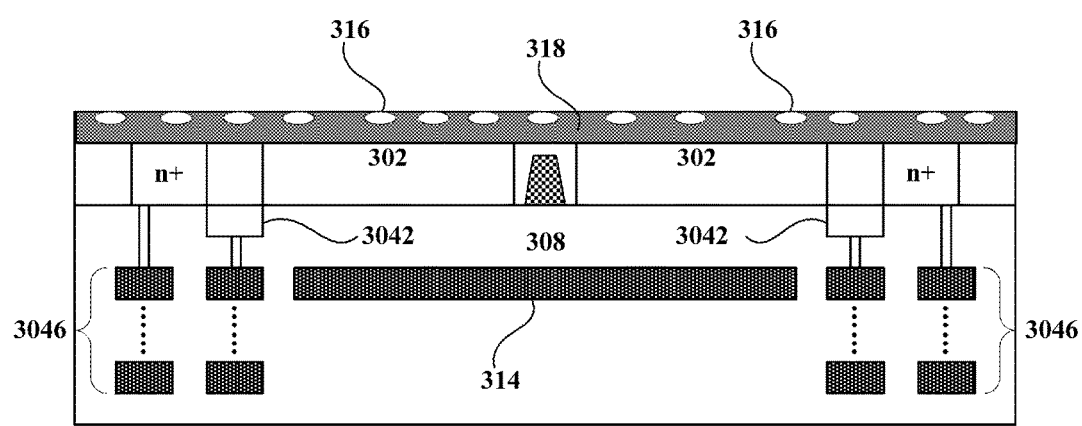

In one embodiment, referring to FIGS. 8A, 8B, and 8C, semiconductor substrate 300 is a P-type substrate, which is doped with a P-type dopant to form a doped layer 318 in the back side of the semiconductor substrate. Thereafter, a laser annealing is performed to activate the P-type dopant, thereby isolating defects 316 in doped layer 318, as shown in FIGS. 9A, 9B, and 9C, respectively. Due to the presence of metal reflective layer 314, the laser light incident from the back side of the semiconductor substrate will be reflected, and heat radiation generated by the melting of the semiconductor material is also reflected by the metal reflective layer so that damage to multilayer interconnect structure 3046 may be reduced or eliminated during the layer annealing and the P-type dopant can more fully activated, thereby effectively reducing the dark current and improving the device performance.

Embodiments of the present disclosure also provide a semiconductor device. The semiconductor device may include a substrate structure including a semiconductor substrate having a front side and a back side, a pixel region having a plurality of pixels in the front side, and a metal reflective layer on the pixel region in the front side. Each pixel includes a sensor element. The back side of the semiconductor substrate is doped with a dopant. The sensor element is configured to receive light incident from the back side of the semiconductor substrate.

In one embodiment, the semiconductor device may further include a multilayer interconnect structure having a plurality of metal interconnect layers disposed outside the pixel region, and a plurality of interlayer dielectric layers disposed between the metal interconnect layers.

In one embodiment, the metal reflective layer is a metal floating layer in direct contact with the pixel region. In another embodiment, the metal reflective layer is closer to the adjacent pixel region than any other metal components in the semiconductor device, as shown in FIG. 6A.

In one embodiment, the sensor element includes a photosensitive element.

In one embodiment, the distance between the upper surface of the multilayer interconnect structure and the back surface of the semiconductor substrate is less than 4 microns (FIG. 7C).

In one embodiment, the semiconductor substrate is a P-type substrate, and the dopant doped in the back side of the semiconductor substrate is a P-type dopant.

In one embodiment, the metal reflective layer includes tungsten, aluminum, or copper.

In one embodiment, the metal reflective layer has a thickness in the range between 2000 angstroms and 5000 angstroms.

While the present disclosure is described herein with reference to illustrative embodiments, this description is not intended to be construed in a limiting sense. Rather, the purpose of the illustrative embodiments is to make the spirit of the present disclosure be better understood by those skilled in the art. In order not to obscure the scope of the disclosure, many details of well-known processes and manufacturing techniques are omitted. Various modifications of the illustrative embodiments as well as other embodiments will be apparent to those of skill in the art upon reference to the description. For example, although the pixel region as shown includes two sensor elements, and an isolation structure is dispose between two adjacent sensor elements, it is understood that the number of sensor elements and isolation structures can be more than two in other embodiments. It is therefore intended that the appended claims encompass any such modifications.

Furthermore, some of the features of the preferred embodiments of the present disclosure could be used to advantage without the corresponding use of other features. As such, the foregoing description should be considered as merely illustrative of the principles of the disclosure, and not in limitation thereof.

What is claimed is:

1. A method for manufacturing a semiconductor device, comprising:
   providing a substrate structure including a semiconductor substrate having a front side and a back side opposite the front side, and a pixel region having a plurality of pixels in the front side, each pixel including a sensor element;
   forming a metal reflective layer on the pixel region in the front side of the semiconductor substrate;
   performing a thinning process on the semiconductor substrate from the back side to thin the semiconductor substrate;
   performing an ion implantation process on the thinned back side of the semiconductor substrate to form a doped back side; and
   performing an annealing process on the doped back side of the semiconductor substrate,
   wherein the metal reflective layer continuously covers two adjacent pixels;
   wherein the sensor element is configured to receive light incident from the thinned back side of the semiconductor substrate.

2. The method of claim 1, further comprising forming an insulation layer between the metal reflective layer and the pixel region.

3. The method of claim 1, wherein forming the metal reflective layer comprises:
   forming a first interlayer dielectric layer on the substrate structure covering the front side of the semiconductor substrate;
   forming a patterned mask layer on the first interlayer dielectric layer;
   etching the first interlayer dielectric layer using the patterned mask layer as a mask to form a recess extending from an upper surface of the first interlayer dielectric layer to a depth above the pixel region and spaced apart from the pixel region; and
   filling the recess with a metal material to form the metal reflective layer.

4. The method of claim 1, further comprising:
   forming a multilayer interconnect structure having a plurality of metal interconnect layers disposed external to the pixel region and a plurality of interlayer dielectric layers disposed between the metal interconnect layers.

5. The method of claim 4, wherein performing the thinning process comprises reducing a portion of the back side of the semiconductor substrate such that a distance between an upper surface of the multilayer interconnect structure and an upper surface of the thinned back side of the semiconductor substrate is less than 4 microns.

6. The method of claim 1, wherein the metal reflective layer is a metal floating layer that is closer to the pixel region than any other metal components adjacent to the pixel region.

7. The method of claim 1, wherein the sensor element is a photosensitive element.

8. The method of claim 1, further comprising forming a contact member in the substrate structure in contact with a surface of an active region external to the pixel region, and forming the metal reflective layer comprises:
   forming a first interlayer dielectric layer on the front side of the substrate;
   etching the first interlayer dielectric layer using a patterned mask layer as a mask to form a first recess extending from an upper surface of the first interlayer dielectric layer to a depth above the pixel region and spaced apart from the pixel region and a second recess in contact with the contact member;
   filling the first and second recesses with a metal material to form the metal reflective layer on the pixel region and a first metal interconnect layer of a multilayer interconnect structure.

9. The method of claim 8, further comprising:
   forming an interconnection layer of the multilayer interconnect structure in addition to the first metal interconnect layer in a portion of the substrate external to the pixel region;
   forming an interlayer dielectric layer between the interconnection layer and the first metal interconnection layer; and
   forming a via extending through the interlayer dielectric layer and connecting the interconnection layer to the first metal interconnection layer.

10. The method of claim 1, wherein the substrate is a P-type semiconductor substrate, and performing the ion implantation process on the thinned back side of the semiconductor substrate comprises a P-type dopant.

11. The method of claim 1, wherein the metal reflective layer comprises tungsten, aluminum, or copper.

12. The method of claim 1, wherein the metal reflective layer has a thickness in a range between 2000 angstroms and 5000 angstroms.

13. A semiconductor device comprising:
   a substrate structure comprising a semiconductor substrate having a front side and a back side and a pixel region in the front side, the pixel region including a plurality of pixels, each pixel including a sensor element; and
   a metal reflective layer disposed on the pixel region in the front side of the semiconductor substrate, wherein the metal reflective layer continuously covers two adjacent pixels, and
   wherein the sensor element is configured to receive incident light to the back side of the semiconductor substrate.

14. The semiconductor device of claim 13, further comprising:
   a multilayer interconnect structure having a plurality of metal interconnect layers disposed external to the pixel region;
   a plurality of interlayer dielectric layers each disposed between two adjacent metal interconnect layers; and
   a plurality of vias extending through the interlayer dielectric layers and configured to connect two adjacent metal interconnect layers of the multilayer interconnect structure.

15. The semiconductor device of claim 14, wherein a distance between an upper surface of the multilayer interconnect structure and an upper surface of the thinned back side of the semiconductor substrate is less than 4 microns.

16. The semiconductor device of claim 13, wherein the metal reflective layer is a metal floating layer that is closer to the pixel region than any other metal components adjacent to the pixel region.

17. The semiconductor device of claim 13, further comprising a dielectric layer disposed between the metal reflective layer and the pixel region.

18. The semiconductor device of claim 13, wherein the semiconductor substrate is a P-type semiconductor substrate, and the back side of the semiconductor substrate is doped with an additional P-type dopant.

19. The semiconductor device of claim 13, wherein the metal reflective layer comprises tungsten, aluminum, or copper.

20. A semiconductor device comprising:
- a substrate structure comprising a semiconductor substrate having a front side and a back side and a pixel region in the front side, the pixel region including a plurality of pixels, each pixel including a sensor element; and
- a metal reflective layer disposed on the pixel region in the front side of the semiconductor substrate and in direct contact with the pixels,
- wherein the sensor element is configured to receive incident light to the back side of the semiconductor substrate.

* * * * *